United States Patent [19]

Elliott et al.

[11] Patent Number: 4,941,795
[45] Date of Patent: Jul. 17, 1990

[54] COMPONENT INSERTION MACHINE APPARATUS

[75] Inventors: William A. Elliott, Reynoldsburg; Richard A. Greene, Pickerington; Robert P. Kennedy, Westerville; Robert P. Poe, Jr.; William H. Steece, both of Columbus, all of Ohio

[73] Assignee: AT&T Bell Laboratories, Murray Hill, N.J.

[21] Appl. No.: 274,098

[22] Filed: Nov. 21, 1988

[51] Int. Cl.⁵ .............................................. H05K 3/30
[52] U.S. Cl. ..................................... 414/403; 221/11; 221/106
[58] Field of Search ....................... 414/413, 403, 404; 221/11, 106, 133

[56] References Cited

U.S. PATENT DOCUMENTS

| | | | |
|---|---|---|---|
| 3,018,001 | 1/1962 | Combs | 211/49 |
| 3,564,691 | 2/1971 | Ackerman | 29/203 |
| 3,704,810 | 12/1972 | Sakai | 221/11 X |
| 4,127,432 | 11/1978 | Kuwano et al. | 156/297 |
| 4,253,585 | 3/1981 | Jamisiewicz et al. | 221/242 |
| 4,354,745 | 10/1982 | Armstrong | 414/404 X |
| 4,393,579 | 7/1983 | Van Hooreweder | 29/740 |
| 4,401,234 | 8/1983 | Droira et al. | 221/92 |
| 4,500,246 | 2/1985 | Janisiewicz et al. | 414/403 X |
| 4,514,958 | 5/1985 | Hoorn | 414/403 X |
| 4,566,164 | 1/1986 | Brown et al. | 29/33 |
| 4,599,026 | 7/1986 | Feiber et al. | 414/126 |
| 4,629,387 | 12/1986 | Stillman et al. | 414/404 |
| 4,632,621 | 12/1986 | Cable | 414/118 |
| 4,636,126 | 1/1987 | Spotts | 414/126 |
| 4,647,269 | 3/1987 | Wedel et al. | 414/403 X |
| 4,653,665 | 3/1987 | Heisner et al. | 221/11 |
| 4,690,302 | 9/1987 | Zebley et al. | 221/11 |
| 4,760,924 | 8/1988 | Sato et al. | 414/403 X |
| 4,763,780 | 8/1988 | Zebley et al. | 206/330 |
| 4,775,280 | 10/1988 | Kelley | 414/414 |
| 4,778,063 | 10/1988 | Ueberreiter | 414/403 X |

FOREIGN PATENT DOCUMENTS

| | | | |
|---|---|---|---|
| 3539965 | 5/1987 | Fed. Rep. of Germany | 414/403 |
| 0976425 | 11/1964 | United Kingdom | 414/403 |

Primary Examiner—Robert J. Spar
Assistant Examiner—John VandenBosche
Attorney, Agent, or Firm—Dwight A. Marshall

[57] ABSTRACT

A component insertion machine having apparatus for mounting component magazines and arranged for loading components therefrom into the component insertion machine. Shuttle apparatus transversely positioned on th e mounting apparatus is arranged to receive ones of the component magazines and is slidably operable for laterally displacing one received component magazine with other received component magazines to maintain a continuous supply of components to the component insertion machine.

1 Claim, 2 Drawing Sheets

COMPONENT INSERTION MACHINE APPARATUS

TECHNICAL FIELD

This invention relates to apparatus for loading components into a component insertion machine.

BACKGROUND OF THE INVENTION

Circuit boards are widely used in the Electrical and Electronics industry in the manufacture of electrical and electronic equipment. Such circuit boards are prepared with printed wiring used to interconnect electrical components such as dual-in-line devices that form elements of the electrical and electronic equipment. Components may be inserted into plated-through holes of the circuit boards and affixed thereto to form connections with the printed wiring to create a composite circuit used in the operation of the electrical and electronic equipment. In another variation, the components may be plugged into a socket located on the circuit board and affixed to the circuit board printed-wiring.

Component insertion machines are used in the manufacture of the circuit boards to automatically insert components stored in component magazines into the circuit boards. Typical component insertion machines usually have a number of component magazines loaded thereon from which stored components are selected and installed into a circuit board in accordance with programmed instructions controlling the operation of the component insertion machine. In the operation of a component insertion machine, the operator or the component insertion machine itself, determines that one of the component magazines is empty and stops the operation so tha the operator may remove the empty component magazine and replace it with another. The component magazines are open at both ends to facilitate the loading of the components into the component magazines and to enable ones of the loaded components to be selected by and loaded into the component insertion machine. An operator is required to hold a finger over an open end while the component magazine is being loaded into the component insertion machine to prevent components from falling out of the component magazines and into the machinery. A problem arises in that it requires a period of time for the operator to locate the replacement component magazine and to carefully maintain a thumb over an open end of the component magazine during the loading of the replacement component magazine into the component insertion machine. During this period of time the component insertion machine is inoperative. Accordingly, a need arises for a component insertion machine that requires less time to load component magazines.

SUMMARY OF THE INVENTION

The foregoing problems are solved and component insertion machines are substantially enhanced by structure transversely positioned on component magazine mounting apparatus for receiving component magazines and slidably operable for laterally displacing one of the received component magazines with others of the received component magazines to maintain a continuous supply of components to the component insertion machine.

The component loading structure comprises a shuttle member having aligned cavities formed therein and mounting component receptacles each arranged to receive a component magazine and align the received component magazine with a corresponding one of the cavities. A base member is mounted on a mounting post and slidably supports the shuttle member which is operable to laterally displace one component magazine and corresponding cavity with other component magazines and corresponding cavities that are aligned by operation of the shuttle member with a mounting post cavity to continuously maintain a supply of components to the component insertion machine.

DETAILED DESCRIPTION

Figure 2:
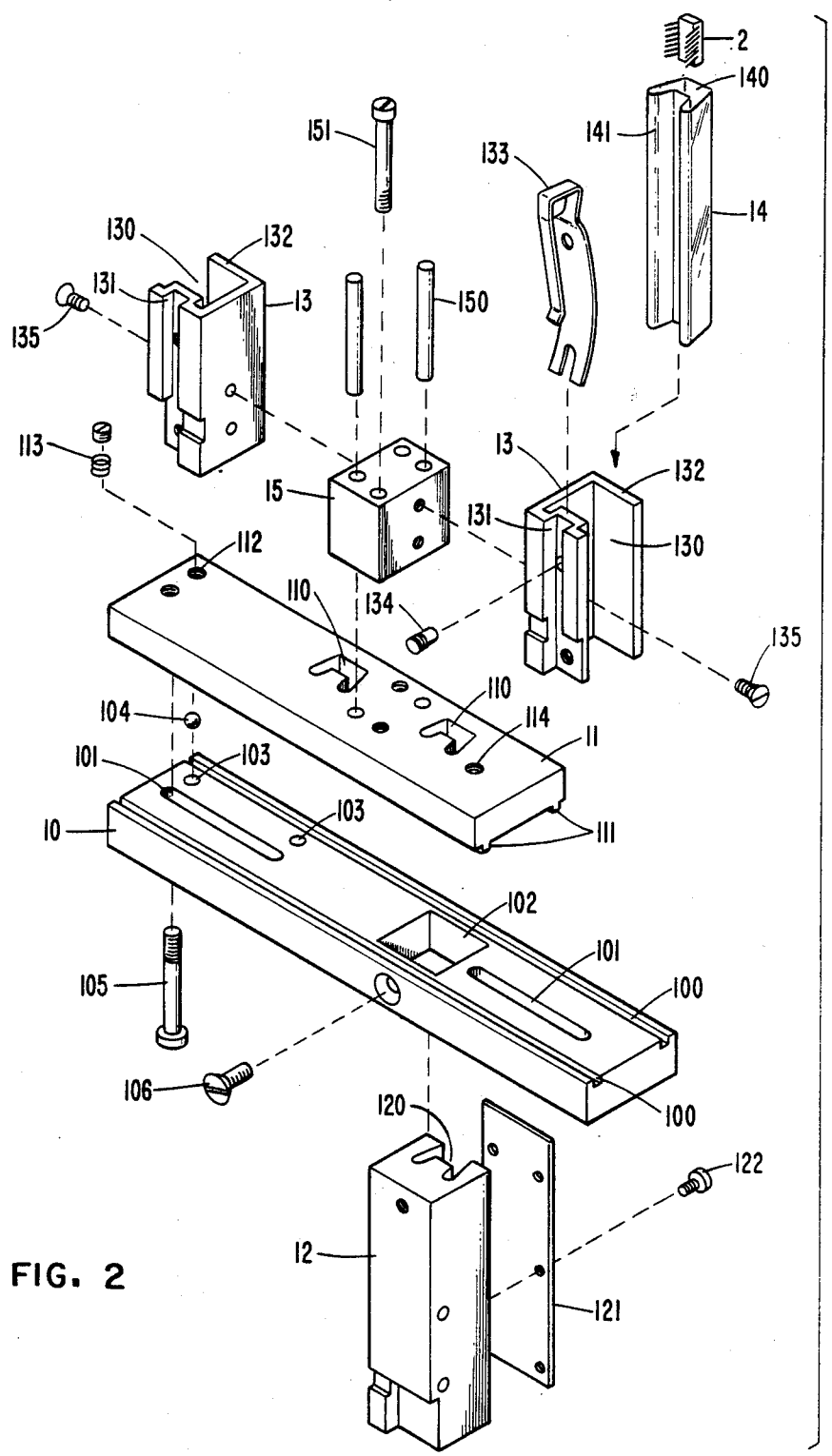
FIG. 2 illustrates an exploded view of the component loading apparatus set forth in FIG. 1.

Circuit boards oftentimes use components 2, FIG. 2, such as dual-in-line devices, having terminals that are intended to be inserted into holes of a circuit board and soldered to printed wiring of the circuit board to form composite electrical and electronic circuits. In the manufacturing process for circuit boards, components 2 are loaded into and stored in a component magazine 14 having a generally U-shaped configuration wherein the bodies of components 2 are loaded into component magazine 14 such that the component terminals extend into corresponding legs 141 of component magazine 14. The construction of component magazines 14 are such that both ends are open so that components 2 may be loaded into or removed therefrom. Component magazines 14 are installed in component loading apparatus that in general extends outward like arms from a component insertion machine. The program controlling operation of the component insertion sequence selects ones of components 2 from the component magazines 14 for installation onto a circuit board.

Figure 1:
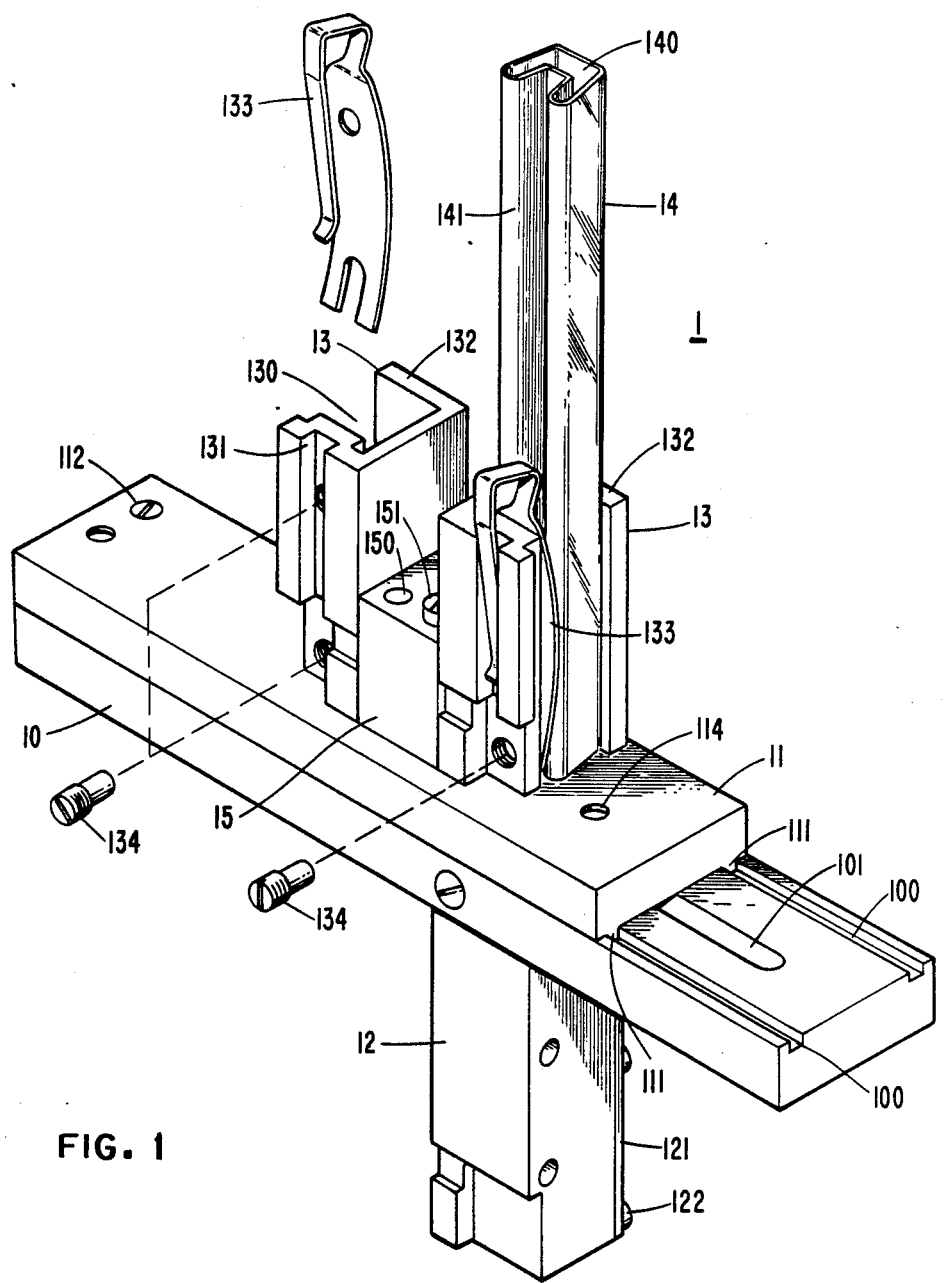
FIG. 1 is a diagram of assembled component loading shuttle apparatus having novel structural features in accordance with the invention for loading component magazines into a component insertion machine.

In accordance with the principles of the invention, shuttle apparatus 1, FIG. 1, includes mounting post 12 having a cavity 120 formed therein for receiving components 2, FIG. 2, that is installed on the component mounting apparatus arms such that a component 2 entering cavity 120 is accepted by the component insertion machine for insertion onto a circuit board. Cavity 120 may be formed in mounting post 12 during a molding process or may be a channel formed into cavity 120 when the channel is covered by cover plate 121 secured by screws 122 to mounting post 12.

Shuttle apparatus 1 further comprises a shuttle plate member 11 having a generally rectangular configuration with a pair of parallel ribs 111 each formed along opposing edges of one side thereof. In addition, shuttle plate member 11 has a number, depending upon the dimensions, of aligned cavities 110 formed therein to correspond with received ones of component magazines 14. Each shuttle plate member cavity 110 is sized to freely receive the body and terminals of component 2 from a component magazine 14 having opening 140 aligned with the shuttle plate cavity 110.

Support blocks 15, FIG. 1, are mounted on shuttle plate member 11 and affixed thereto by dowels 150 and mounting screws 151. A support block 15 mounts a pair of magazine receptacles 13 by screws 135 and each is arranged to receive a component magazine 14 and align the received component magazine 14 with a corresponding shuttle plate cavity 110 such that a component 2 stored in component magazine 14 may be received by shuttle plate cavity 110.

Component magazine receptacles 13 slidably receive component magazines 14 and aligns each received component magazine 14 with a shuttle plate cavity 110. Each magazine receptacle 13 has a generally L-shaped guide section 132 for aligning a component magazine 14 with a corresponding shuttle plate cavity 110. Another guide section 131 of magazine receptacle 13 cooperates with guide section 132 to slidably receive a component magazine 14. Guide section 131 has a pair of vertically aligned pin members 134 extending perpendicularly outward from a surface thereof toward an opposing side of guide section 132 to receive the slot of a received component magazine 14 and guide the received component magazine 14 into alignment with guide section 132. A spring member 133, affixed to guide section 131 by a pin member 134, has one end thereof formed to extend backwards into guide section 131 and the opposite end formed with a slot to receive the lower positioned pin member 134. The outwardly bowed section of spring member 133 compensates for variations that may occur in the size of various component magazines 14 by maintaining the received component magazine in alignment with guide section 132.

Shuttle apparatus 1, FIG. 1, also includes a generally rectangularly configured base plate member 10 having a pair of parallel channels 100 each formed on one side along opposing sides thereof. Each channel 100, FIG. 2, corresponds with a rib 111 of shuttle plate 11 and is intended to receive a rib 111 such that shuttle plate member 11 is slidably supported by base plate member 10 and free to move lengthwise along and with respect thereto. Base plate member 10 has an aperture 102 corresponding in size to mounting post 12 so that base plate member 10 may be mounted thereon by mounting screw 106. A pair of slots 101 are formed lengthwise along a lateral axis of base plate member 10 and serve to receive a pair of bolts 105 that are free to move within slots 101 and secure shuttle plate member 11 to base plate member 10 while enabling shuttle plate member 11 to move with respect thereto.

Base plate member 10, FIG. 2, has a series of aligned indentions 103 formed to partially receive bearing 104 with each indention 103 positioned along one side of base plate member 10 at a distance from an adjacent indention 103 corresponding to the distance between shuttle plate cavities 110. Shuttle plate member 11 also has a cavity 112 formed to partially receive bearing 104 and a spring member 113 located therein to exert a force on bearing 104 such that when shuttle plate member 11 is slidably mounted on base plate member 10 the positioning of bearing 104 in an indention 103 ensures the alignment of a shuttle plate cavity 110 with mounting post cavity 120.

In assembly, mounting post 12, FIG. 1, is installed on a component loading apparatus arm and base plate member 10 mounted thereon to transversely extend across the arm and with respect to a row of component magazines 14 normally mounted on the arm. Shuttle plate member 11 is slidably mounted on base plate member 10 with shuttle plate member ribs 111 positioned in base plate member channels 100. Bearing 104, FIG. 2, is initially positioned within one of the indentions 103 such that one shuttle plate member cavity 110 is aligned with mounting post cavity 120. Component magazines 14, FIG. 1 are installed in each of the shuttle plate member component magazine receptacles 13 with one of components 2 stored in each component magazine 14 received by a corresponding shuttle plate cavity 110 aligned therewith. Components 2 stored in the one received component magazine 14 aligned with both a shuttle plate member cavity 110 and mounting post cavity 120 are received by both cavities 110 and 120 and are ready for loading into the component insertion machine.

During operation, components 2 are fed into the component insertion machine from the one component magazine 14 through aligned shuttle plate member cavity 110 and mounting post cavity 120. When the component insertion machine detects the absence of components 2 at the output of mounting post cavity 120 indicating an empty component magazine 14, shuttle plate member 11 is slidably operated by being moved along channels 100 with respect to base plate member 10 to laterally displace the one component magazine 14 with another. With bearing 104, positioned in a base plate member indentation 103 corresponding with the other component magazine 14, components 2 are fed from the other component magazine 14 through the shuttle plate member cavity 110 aligned therewith and mounting base cavity 120 into the component insertion machine. The empty displaced component magazine 14 may be subsequently removed or replaced by a loaded component magazine 14. Operation of shuttle apparatus 1 is continued to maintain a continuous supply of components 2 to the component insertion machine.

When the shuttle apparatus of the invention has been disclosed as being transversely mounted on an arm of a component insertion machine it is to be understood that such an embodiment is intended to be illustrative of the principles of the invention in that numerous other arrangements may be devised by those skilled in the art without departing from the spirit and scope of the invention. For example, the shuttle apparatus may be mounted in-line with an arm of the feed apparatus of a component insertion machine so that component magazines may be laterally displaced with respect thereto to maintain a constant flow of components while minimizing interruption of the component insertion machine operation. It is also to be understood that various types of control apparatus could be used to operate the shuttle apparatus to laterally displace the component receptacles mounted thereon.

We claim:

1. Shuttle apparatus for loading components stored in component magazines into a component insertion machine having a mounting post formed with a first cavity therein for receiving ones of the components wherein said shuttle apparatus comprises a generally rectangularly configured shuttle member having a pair of parallel ribs each formed on a bottom surface of said shuttle member and having a plurality of aligned second cavities formed therein and mounting component magazine receptacles on a top surface for receiving ones of the component magazines and aligning each received component magazine with a corresponding one of said second cavities, and a generally rectangularly configured base member having an aperture formed therein for receiving the mounting post and having a pair of slots formed along a lateral axis to receive restraining devices free to move within said slots with said slots in combination with a pair of parallel channels each formed along an upper surface thereof to correspond with and receive one of said shuttle member ribs for securing and slidably supporting said shuttle member and enabling the operation thereof for laterally displacing one of said received component magazines with others of received component magazines by aligning ones of said shuttle member second cavities with said first cavity to maintain a continuous supply of components to the component insertion machine.

* * * * *